United States Patent [19]

Norris et al.

[11] 3,735,482

[45] May 29, 1973

[54] METHOD OF MAKING AN MOS TRANSISTOR INCLUDING A GATE INSULATOR LAYER OF ALUMINUM OXIDE AND THE ARTICLE SO PRODUCED

[75] Inventors: Peter Edward Norris; Frank Benjamin Micheletti, both of Princeton, N.J.

[73] Assignee: RCA Corporation, New York, N.Y.

[22] Filed: June 16, 1971

[21] Appl. No.: 153,662

[52] U.S. Cl. ........................29/571, 29/578, 204/15, 204/164

[51] Int. Cl. ............................................B01j 17/00

[58] Field of Search ..................29/571, 578; 204/15, 204/164; 156/17

[56] References Cited

UNITED STATES PATENTS

| | | | |
|---|---|---|---|
| 3,447,238 | 6/1969 | Heynes et al. | 29/590 |
| 3,556,966 | 1/1971 | Waxman et al. | 204/164 |
| 3,604,107 | 9/1971 | Fassett | 29/571 |
| 3,634,204 | 1/1972 | Dhaka et al. | 204/15 |

*Primary Examiner*—Charles W. Lanham
*Assistant Examiner*—W. Tupman
*Attorney*—Glenn H. Bruestle

[57] ABSTRACT

A method of making an MOS transistor which has a gate insulator layer composed of aluminum oxide made by plasma anodizing a thin layer of aluminum, in which the thin aluminum layer and the anodized layer are not defined by etching. The gate electrode insulator layer is formed by depositing a thin layer of aluminum over the entire surface of the device after the source and drain contacts are made and then converting the entire aluminum layer to aluminum oxide.

4 Claims, 15 Drawing Figures

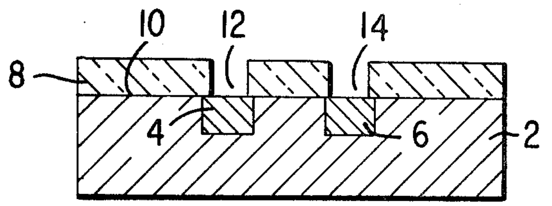
PRIOR ART
FIG. 1
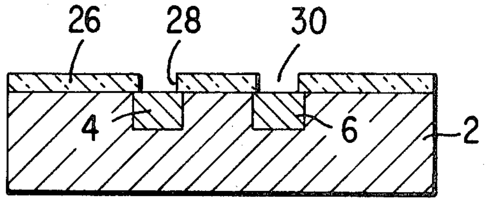
PRIOR ART
FIG. 7
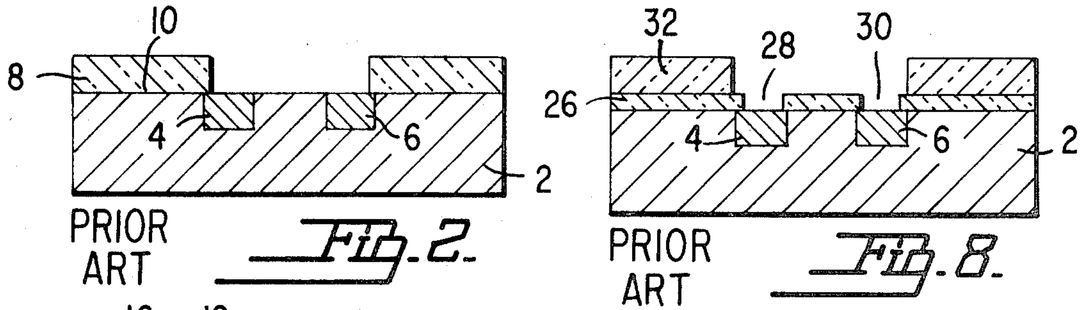
PRIOR ART FIG. 2, PRIOR ART FIG. 8
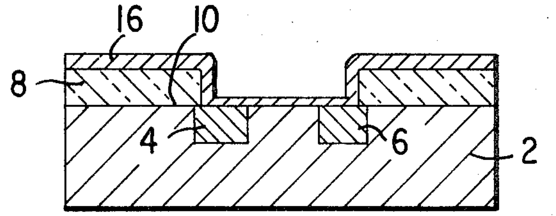
PRIOR ART
FIG. 3
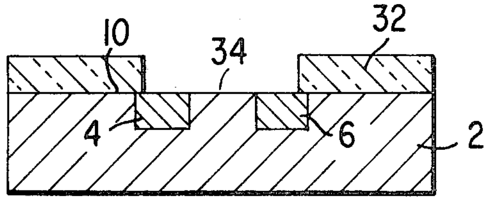
FIG. 9
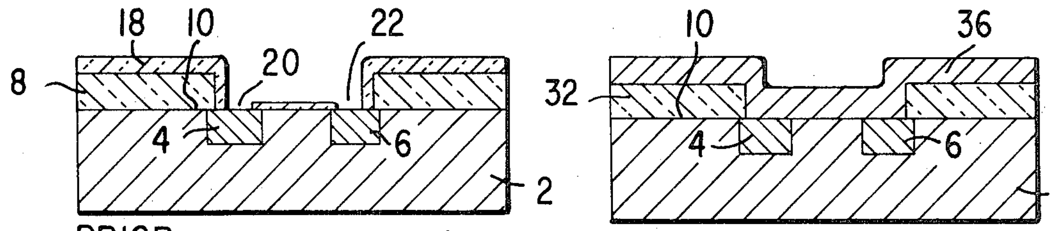
PRIOR ART FIG. 4, FIG. 10
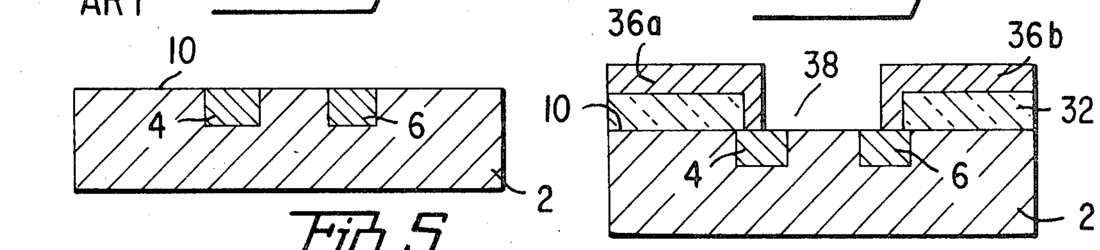
FIG. 5, FIG. 11
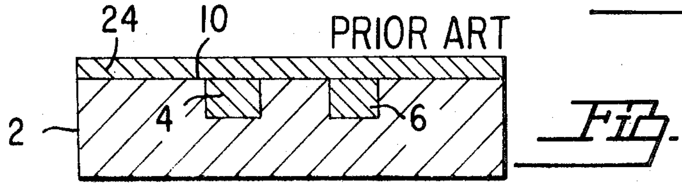
PRIOR ART
FIG. 6
INVENTORS.
PETER E. NORRIS &
FRANK B. MICHELETTI
BY W. S. Hill
AGENT INVENTORS.
PETER E. NORRIS &
FRANK B. MICHELETTI
BY W. S. Hill
AGENT

METHOD OF MAKING AN MOS TRANSISTOR INCLUDING A GATE INSULATOR LAYER OF ALUMINUM OXIDE AND THE ARTICLE SO PRODUCED

BACKGROUND OF THE INVENTION

Although silicon dioxide has been generally used as dielectric thin film material for semiconductor devices and microelectronic circuit applications, there are some applications in this field in which it has been found to be of advantage to use a dielectric material other than silicon dioxide. One of these applications is the gate insulator layer of MOS transistors. Although silicon dioxide has been previously used for this type of application, it has been found that aluminum oxide offers some unexpected advantages. For example, the impurities generally found associated with silicon dioxide are relatively mobile and can result in device instability at room or elevated temperatures. On the other hand, impurities that are usually associated with aluminum oxide, are relatively fixed and therefore do not cause device instabilities and uncertainties.

Another advantage that aluminum oxide has over silicon dioxide is that the former has been found to be more resistive to radiation effects than the latter. Over a period of time, MOS transistors having silicon dioxide gate insulator layers could, when used in space vehicle circuits, gradually deteriorate and become useless. Similar devices employing gate insulator layers of sluminum oxide have been found to have a longer useful lifetime.

Recognizing the advantages of aluminum oxide as a gate insulator layer for MOS transistors, circuit manufacturers have attempted to employ it but have run into difficulties which have limited its use. An example of these difficulties is that an attractive way to make an aluminum oxide insulator layer is to deposit first a thin film of aluminum having a thickness of the order of 400 Angstroms and then convert the thin aluminum film to oxide by plasma anodizing. However, the oxide film is very fragile. If one attempts to define the gate electrode insulator area by the usual technique of applying a layer of photoresist, exposing the photoresist by shining light through a master, then developing the photoresist with a solvent for the unhardened areas, and removing exposed aluminum oxide by etching, some of the aluminum oxide tends to become removed from areas where it is to be retained, when the overlying photoresist is later removed. This difficulty has contributed to causing MOS transistor manufacturing processes which include use of etch-defined aluminum oxide films, to be a low-yeild, high-cost proposition. It is highly desirable to have a process of making semiconductor devices including very thin aluminum oxide films which avoids the necessity of using an etching step after the film is deposited.

Another method which has been tried is to deposit a very thin film of aluminum on the entire surface of a device, etch to define the desired aluminum pattern and then convert the defined aluminum pattern to oxide. Disadvantages of this method are (1) the aluminum film is fragile and easily damaged during the etching step, and (2) when covered with photoresist and the photoresist then developed, any imperfections in the photoresist film may cause corresponding imperfections in the fragile aluminum film.

Plasma anodizing is not the only method of making an aluminum oxide film. A film of aluminum oxide can be deposited by chemical vapor deposition, for example, but techniques such as this require relatively high temperatures up to as high as 1000° C. and some semiconductor materials are temperature sensitive. It is preferable to use lower processing temperatures where feasible. Plasma-anodized aluminum oxide, on the other hand, is deposited by a low temperature process. Temperatures of only about 50° C. can be used in this type of process. This is another reason why the plasma anodization process is attractive for depositing aluminum oxide.

Another advantage of aluminum oxide deposited by aluminum plasma anodization is that it has less excess oxide charge than aluminum oxide deposited by other processes and, for reasons including this one, there are more suitable interface conditions between the oxide and the silicon or other semiconductor body on which the oxide is deposited.

THE DRAWING

FIG. 1 is a cross-section view of an MOS transistor at an intermediate stage of manufacture according to prior art techniques;

FIGS. 2, 3 and 4 are section views of further advanced stages in making an MOS transistor according to one embodiment of prior art techniques;

Figure 12:
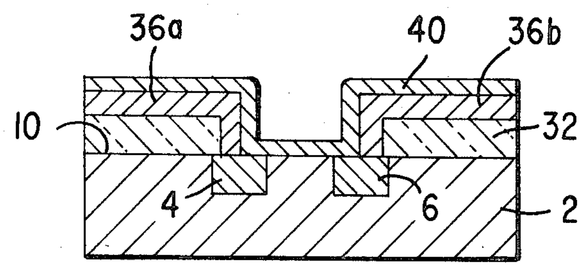
Figure 13:
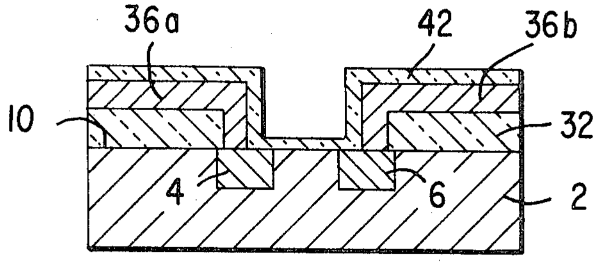
Figure 14:
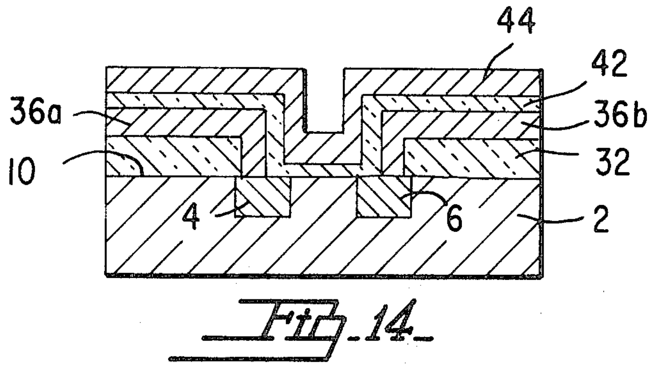
Figure 15:
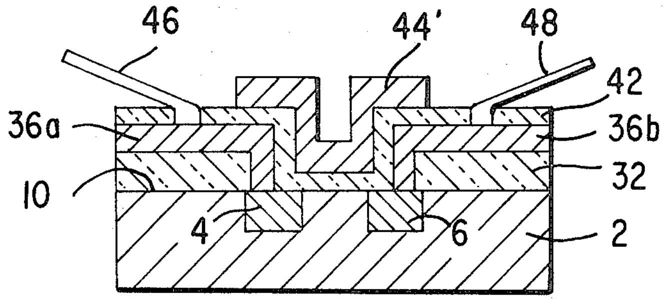

FIGS. 5, 6 7 and 8 illustrate successive intermediate stages in manufacturing an MOS transistor according to a second prior art method;

FIGS. 9–14, inclusive, are cross-section views showing successive intermediate stages in making an MOS transistor according to the present invention; and FIG. 15 is a cross-section view of a completed MOS transistor made according to the present invention.

DESCRIPTION OF PRIOR ART EMBODIMENTS

Referring to FIG. 1, prior art MOS transistors have usually been made including a stage of manufacture as illustrated in this Figure. At this intermediate stage of manufacture, the device comprises a silicon semiconductor body 2 of one conductivity type, for example N-type, a source region 4, and a drain region 6 of opposite conductivity type, i.e. P+ type. At this stage, the device also includes a relatively thick silicon dioxide layer 8 having portions overlying all parts of the upper surface 10 of the semiconductor body 2, except openings 12 and 14 which expose the source region 4 and the drain region 6, respectively.

In making a device in which aluminum oxide is used as the gate electrode insulator layer, from this point prior art methods of manufacture have usually taken either one of two directions. In one of these (FIG. 2) part of the thick silicon dioxide layer 8 was removed so that no oxide remained over the space between the source region 4 and the drain region 6. Then, as shown in FIG. 3, a very thin layer of aluminum 16 was deposited over the entire wafer including both the top surface of the remaining silicon dioxide layer 8 and the exposed surface of the wafer from which part of the silicon dioxide layer had been removed. Then, as shown in FIG. 4, this layer of aluminum 16 was converted to aluminum oxide 18 by plasma anodization; and by standard photomasking and etching techniques, openings 20 and 22 were made in the film 18 over source and drain regions 4 and 6, respectively. Later a thicker layer of aluminum (not shown) was deposited over the entire wafer and defined by etching so that aluminum extended from each of the source and drain regions over the oxide coating 18 to the edges of the wafer where contact pads were provided for wire bonding leads.

As indicated above, a major disadvantage of this method is that when the thin coating of aluminum oxide is etched to form the openings 20 and 22, some of the oxide which it is desired to retain, often lifts off the surface of the silicon body.

In an alternative method according to the prior art, all of the original silicon dioxide coating is removed from the semiconductor body 2(FIG. 5) and a thin coating of aluminum 24 is deposited (FIG. 6) over the entire top surface 10 of the silicon body. Next, the aluminum coating 24 is converted to an oxide coating 26 by plasma anodization, and openings 28 and 30 are provided over the source and drain regions 4 and 6, respectively (FIG. 7), by conventional photomasking and etching techniques.

As shown in FIG. 8, a relatively thick coating of silicon dioxide 32 is then deposited on top of the aluminum oxide coating 26 except in the central portion of the device and in and adjacent the openings 28 and 30.

Finally (not shown) a layer of aluminum is deposited over the silicon dioxide and extending down into the openings 28 and 30 to make contact with the source and drain regions 4 and 6. This aluminum coating is then defined to form ribbon-like leads for the source and drain and bonding pads adjacent the periphery of the chip. The thick coating of silicon dioxide (or other suitable insulating material) is needed so that wire lead contact to bonding pads may be carried out without damage to the insulating layer. Like the first method of the prior art described above, this second prior art method also includes a step of etching a thin layer of aluminum oxide to form an oxide pattern. It therefore suffers from the same disadvantages as the first method.

DESCRIPTION OF PREFERRED EMBODIMENTS OF PRESENT INVENTION

In carrying out the method of the present invention, (FIG. 9) a silicon semiconductor wafer 2 having an upper surface 10, is provided with source and drain regions 4 and 6, respectively. The upper surface 10 of the wafer is also provided with a silicon dioxide coating 32 having a thickness of about 5000 Angstroms. Other suitable passivating materials such as silicon nitride can be used. The silicon dioxide coating 32 has a central opening 34 therein exposing most of the source and drain regions 4 and 6 and the space therebetween which is to become the gate region of the completed transistor.

As shown in FIG. 10, a relatively thick aluminum layer 36, about 1000 Angstroms in thickness, is deposited on top of the silicon dioxide layer 32 and on top of the silicon body surface 10 which is within the opening 34. This layer may be deposited by well known evaporation processes and must be sufficiently thick to be a good ohmic conductor of electricity and rugged enough to serve as bonding pads at locations remote from the active region of the transistor.

As shown in FIG. 11, part of the aluminum layer 36 resting on the surface 10 of silicon body 2 is removed by etching, leaving an opening 38 which exposes part of the source and drain region surfaces 4 and 6 and the space between these two regions. Much of the aluminum layer 36 on the silicon dioxide layer 32 is also removed leaving a ribbon-like portion **36*a* making contact to the source region 4 and another similar portion 36*b* making contact to the drain region 6**. The aluminum may be etched using a 10 percent by weight solution of sodium hydroxide or a solution made up of 5 parts by volume Conc. $H_3PO_4$, 1/5 part by volume Conc. $HNO_3$, 1 part by volume glacial Acetic Acid and 1 part by volume water.

Next a very thin layer of aluminum 40 (FIG. 12) having a thickness of between about 250 and 800 Angstroms, is vacuum-deposited over the entire top surface of the wafer including the thick aluminum layers **36*a* and 36*b* and the previously formed opening 38. The aluminum layer 40 is then converted to a layer of aluminum oxide 42 (FIG. 13**) by a plasma anodization process. A plasma anodization process suitable for carrying out this step is fully described in U.S. Pat. No. 3,556,966 issued Jan. 19, 1971 to Waxman and Zaininger. This is essentially a low temperature process carried out at temperatures of about 50° C. or less.

For anodization of a layer of aluminum 420 A thick, more exact parameters of anode to cathode voltage, plasma current, final applied voltage and total time of anodization are given in an article in Solid State Technology, April 1971, pages 27-31, entitled "Plasma Grown $Al_2O_3$ for COS/MOS Integrated Circuits" by Micheletti, Norris and Zaininger. Next, a relatively thick coating of aluminum 44 (FIG. 14) is deposited over the entire top surface of the wafer. This coating of aluminum also has a thickness of about 5000 Angstroms. Most of the aluminum coating 44 is removed by etching, as described above, to leave a gate electrode layer 44' (FIG. 15). The device is completed by ultrasonically bonding a wire 46 through the thin oxide layer 42 and making contact to the thick aluminum layer 36a which makes contact to the source region 4. A similar wire lead 48 is bonded through the aluminum oxide layer 42 making contact to the aluminum layer **36*b* which contacts the drain region 6. Another wire lead (not shown) is bonded to a bonding pad connected by an aluminum ribbon to the gate electrode layer 44'**.

It will be noted that this transistor has been made without etching the thin aluminum oxide coating 42 after it is deposited. Thus, some disadvantages of the use of aluminum oxide as a gate electrode insulator which were formerly encountered have been overcome.

We claim:

1. In a method of fabricating an MOS transistor of the type including a silicon semiconductor body of one conductivity type, spaced, source and drain regions of different conductivity type extending to a surface of said body, and a gate electrode composed of (1) a layer of oxide on said surface of said body between said source and drain regions and (2) a layer of metal on said oxide, the steps of:

forming a relatively thick layer of a passivating dielectric material on said surface except over most of said source and drain regions and the space therebetween, depositing separate relatively thick ribbon-like layers of a contact metal on each of said source and drain regions and extending continuously over the surface of said passivating layer to locations remote from said source and drain, depositing a relatively thin layer of aluminum over the entire surface of said thick passivating layer, said layer of contact metal and said space between said source and drain regions which will be the gate region of said transistor, converting said thin aluminum layer to aluminum oxide by plasma anodization, depositing a relatively thick layer of metal on said aluminum oxide only over said gate region and closely adjacent areas, and making electrode connections to said relatively thick ribbon-like layers of contact metal.

2. A method according to claim 1 in which said electrode connections are made of bonding electrode wires through said aluminum oxide layer.

3. A method according to claim 1 in which said thick aluminum layer has a thickness of about 5000 Angstroms and said thin aluminum layer has a thickness of about 250–800 Angstroms.

4. In a method of fabricating an MOS transistor of the type including a silicon semiconductor body of one conducitivity type, spaced, source and drain regions of different conductivity type extending to a major surface of said body and a gate electrode composed of a layer of oxide on said surface of said body between said source and drain regions and a layer of metal on said oxide, the steps of:

forming a relatively thick layer of silicon dioxide on said surface, removing the silicon dioxide of said layer which is over the area of said gate electrode and said source and drain regions, depositing a relatively thick layer of a contact metal over said entire wafer surface, defining metal connections for said source and drain regions from said layer of contact metal and removing said contact metal from the remaining portions of said wafer surface, depositing a relatively thin layer of aluminum over said entire wafer surface including an exposed silicon surface at the gate region, converting said thin aluminum metal layer to aluminum oxide by anodization, depositing a relatively thick layer of metal on said aluminum oxide over said gate region, and defining said last mentioned metal layer to form a gate electrode.

* * * * *